(12) United States Patent
Yang et al.

(10) Patent No.: US 11,508,886 B2
(45) Date of Patent: Nov. 22, 2022

(54) MULTI-COLOR TEMPERATURE AND MULTI-CHANNEL EMC BRACKET STRUCTURE

(71) Applicant: FUJIAN LIGHTNING OPTOELECTRONIC CO., LTD., Quanzhou (CN)

(72) Inventors: Haoyu Yang, Quanzhou (CN); Yu Chen, Quanzhou (CN); Chihung Chang, Quanzhou (CN); Juihung Yuan, Quanzhou (CN); Kuochan Hung, Quanzhou (CN); Xihong Wan, Quanzhou (CN); Shenche Lee, Quanzhou (CN); Hungyang Lin, Quanzhou (CN)

(73) Assignee: FUJIAN LIGHTNING OPTOELECTRONIC CO., LTD., Quanzhou (CN)

( * ) Notice: Subject to any disclaimer, the term of this patent is extended or adjusted under 35 U.S.C. 154(b) by 66 days.

(21) Appl. No.: 16/950,347

(22) Filed: Nov. 17, 2020

(65) Prior Publication Data

US 2021/0151645 A1 May 20, 2021

(30) Foreign Application Priority Data

Nov. 18, 2019 (CN) .......................... 201921993765.4

(51) Int. Cl.
*H01L 33/56* (2010.01)
*H01L 33/62* (2010.01)
(Continued)

(52) U.S. Cl.
CPC ............ *H01L 33/56* (2013.01); *H01L 27/156* (2013.01); *H01L 33/502* (2013.01); *H01L 33/62* (2013.01); *H05B 45/28* (2020.01)

(58) Field of Classification Search
CPC ..... H01L 33/56; H01L 27/156; H01L 33/502; H01L 33/62; H01L 33/50; H01L 25/0753; H05B 45/28
See application file for complete search history.

(56) References Cited

U.S. PATENT DOCUMENTS

2019/0067170 A1* 2/2019 Zhang ................. H01L 25/0753
2020/0105649 A1* 4/2020 Lin .................... H01L 23/49562
(Continued)

*Primary Examiner* — Jonathan Han
(74) *Attorney, Agent, or Firm* — Bayramoglu Law Offices LLC

(57) ABSTRACT

A multi-color temperature and multi-channel EMC bracket structure comprises a metal substrate with more than three pads arranged on a periphery thereof as multi-block electrodes. A cup-shaped insulating resin dam is located on the metal substrate. Part of the pad is located inside the insulating resin dam and another part of the pad is located outside the insulating resin dam. At least one white resin partition is arranged inside the insulating resin dam to divide the metal substrate into multiple areas for arranging different LED chip circuits respectively. The LED chip circuit comprising a plurality of LED chips. The spaces inside the cup-shaped insulating resin dam with respective to different LED chip circuits are encapsulated by fluorescent layers respectively, and the fluorescent layer is located on the LED chip. The present invention can be controlled in regions to achieve the effect of different color temperature.

3 Claims, 6 Drawing Sheets

(51) Int. Cl.
 *H01L 33/50* (2010.01)
 *H01L 27/15* (2006.01)
 *H05B 45/28* (2020.01)

(56) References Cited

U.S. PATENT DOCUMENTS

2021/0050333 A1* 2/2021 Lin ................... H01L 25/0753
2021/0050473 A1* 2/2021 Shi ..................... H01L 33/005
2021/0286235 A1* 9/2021 Lee .................... H01L 33/486

* cited by examiner

MULTI-COLOR TEMPERATURE AND MULTI-CHANNEL EMC BRACKET STRUCTURE

CROSS-REFERENCE TO RELATED APPLICATION

This application claims the priority benefit of CN Patent Application No. 201921993765.4 filed on Nov. 18, 2019. The entirety of the above-mentioned patent application is hereby incorporated by reference herein and made a part of the specification.

BACKGROUND OF THE INVENTION

Field of the Invention

The present invention relates to the technical field of LED lighting, and in particular to a multi-color temperature and multi-channel EMC bracket structure.

Description of the Related Art

Epoxy Molding Compound (EMC) is a highly integrated packaging architecture that uses new epoxy materials and etching technology together with the packaging of molding equipment.

Traditional EMC multi-color temperature products are provided by combining multiple light-emitting diode (LED) packages. It is rare to show multiple color temperatures in one LED package. The advantage of integrating multiple LED chips under the same light-emitting surface of the LED package is that the light shape is easy to manipulate, and the existing LED optical lens can be used in the EMC multi-color temperature products directly. The disadvantage of the existing technology is that: the existing multi-color temperature product is composed of multiple LED packages, and the overall product size is much larger than the original product. As a result, the lamp lens needs to be redesigned, the shape has many restrictions, and the traditional bracket is not thermoelectric separation and the heat dissipation capacity is poor.

BRIEF SUMMARY OF THE INVENTION

In order to overcome the above mentioned problems, it is an object of the present invention to provide a multi-color temperature and multi-channel EMC bracket structure, which is capable to control the color temperature in multiple regions to increase product diversity and to improve product strength.

The present invention provides a multi-color temperature and multi-channel EMC bracket structure. The multi-color temperature and multi-channel EMC bracket structure comprises a metal substrate. More than three pads are arranged on a periphery of the metal substrate, wherein the pads are used as multi-block electrodes of the metal substrate. A cup-shaped insulating resin dam is located on the metal substrate, wherein part of the pad is located inside the insulating resin dam, and another part of the pad is located outside the insulating resin dam. At least one white resin partition is arranged inside the insulating resin dam to divide the metal substrate into multiple areas. Multiple LED chip circuits are respectively arranged in the areas. The LED chip circuit comprises a plurality of LED chips, wherein first one and last one of the multiple LED chips are connected to two of the three pads, and adjacent two of the multiple LED chips are connected by wiring. The spaces inside the cup-shaped insulating resin dam with respective to the different LED chip circuits are encapsulated by fluorescent layers respectively, and the fluorescent layer is located on the LED chip.

In accordance with an embodiment of the present invention, a number of the pads is four, and the four pads are located at four corners of the metal substrate, and among the four pads, two pads on a side of a separated island are used as multi-block negative electrodes, and the remaining two pads are used as multi-block positive electrodes.

In accordance with an embodiment of the present invention, two white resin partitions are arranged inside the insulating resin dam, to divide the metal substrate into three areas for arranging different LED chip circuits.

The beneficial effects of the present invention are as follows:

1. Multi-color temperature products can be designed with the appearance of the traditional bracket to achieve direct replacement of the products and improve production efficiency.
2. Multi-block color temperature control may increase product diversity and application markets.
3. The present invention is related to a thermoelectric separation EMC bracket, which may improve reliability.
4. Fluorescent glue may be dispensed on the cup-shaped space with respective to different circuits for regional control to achieve the effect of different color temperature.

DETAILED DESCRIPTION OF THE EMBODIMENTS

Figure 1:
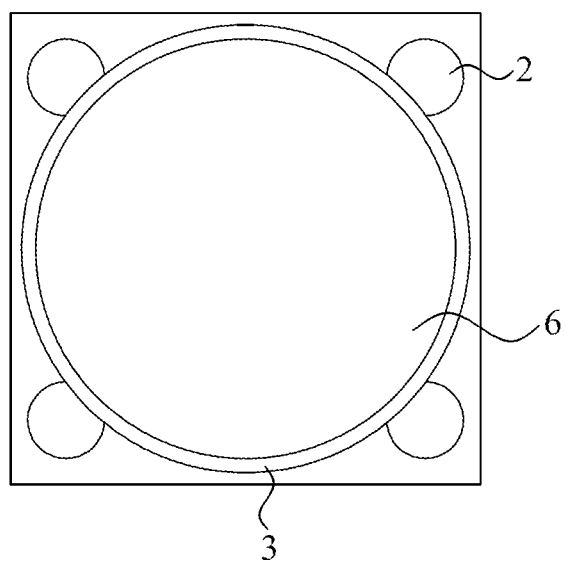
FIG. 1 is a schematic diagram showing the structure of the present invention.
Figure 2:
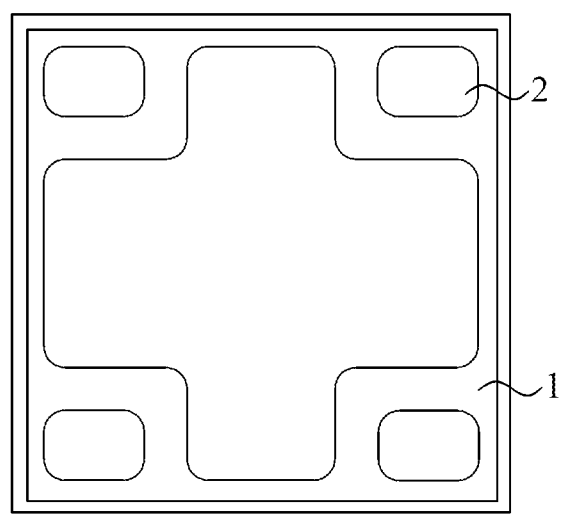
FIG. 2 is a structural schematic diagram of a rear side showing the metal substrate integrated with the pad in accordance with the present invention.
Figure 3:
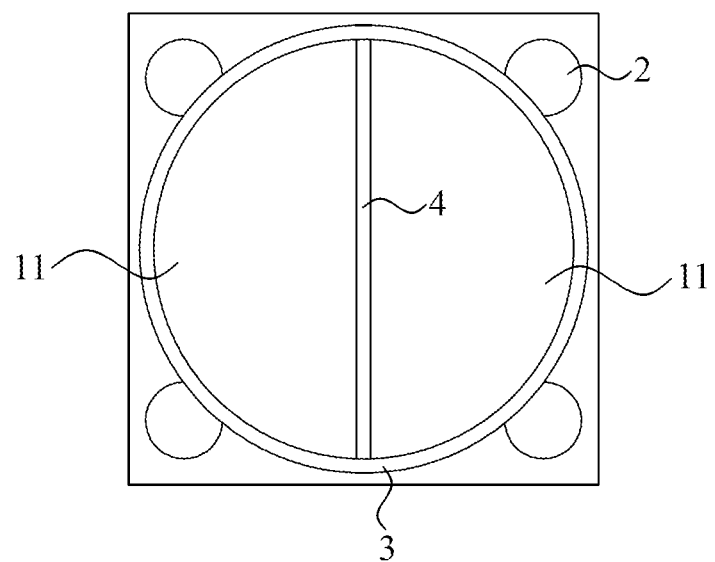
FIG. 3 is a structural schematic diagram in accordance with a first embodiment of the present invention with the fluorescent layer and the LED chip circuit being skipped.
Figure 4:
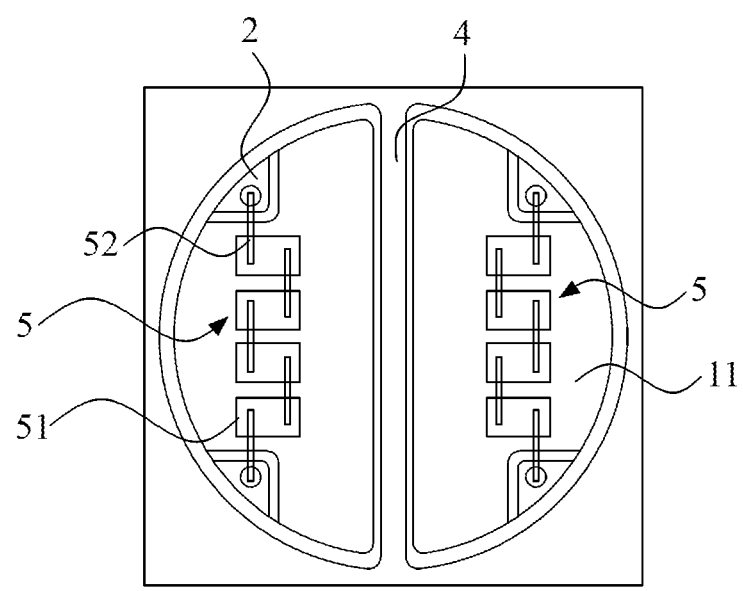
FIG. 4 is a schematic cross-sectional view of the first embodiment of the present invention.

These and other features, aspects and advantages of the present invention will become better understood with regard to the following description, appended claims, and accompanying drawings.

Please refer to FIG. 1 to FIG. 4, a multi-color temperature and multi-channel EMC bracket structure is provided in accordance with the first embodiment of the present invention. The multi-color temperature and multi-channel EMC bracket structure comprises a metal substrate 1. More than three pads 2 are arranged on a periphery of the metal substrate 1. The pads 2 serves as multi-block electrodes of the metal substrate 1. The metal substrate 1 is provided with a cup-shaped insulating resin dam 3. Part of the pad 2 is located inside the insulating resin dam 3, and another part of the pad 2 is located outside the insulating resin dam 3. There has at least one white resin partition 4 arranged inside the insulating resin dam 3, and the white resin partition 4 has the metal substrate 1 divided into a plurality of areas 11. Different LED chip circuits 5 are arranged in different areas 11 respectively. The LED chip circuit 5 comprises a plurality of LED chips 51. The first one and the last one of the multiple LED chips 51 are connected to two of the three pads 2, that is, the pads are used as the negative electrode and the positive electrode of multi-block electrodes. Each area can be equipped with different LED chip circuits. The adjacent two of the multiple LED chips 51 are connected by using golden wire 52. The spaces inside the cup-shaped insulating resin dam with respective to different LED chip circuits 5 are encapsulated with fluorescent layers 6 respectively, and the fluorescent layer 6 is located on the LED chip. In this way, the EMC bracket structure is not limited to provide the illumination with two color temperatures, multiple color temperatures may coexist in the EMC bracket structure as long as the positive and negative electrodes can be electrically separated. In this way, the multi-color temperature LED chip circuits may not increase the size of the overall product.

Figure 5:
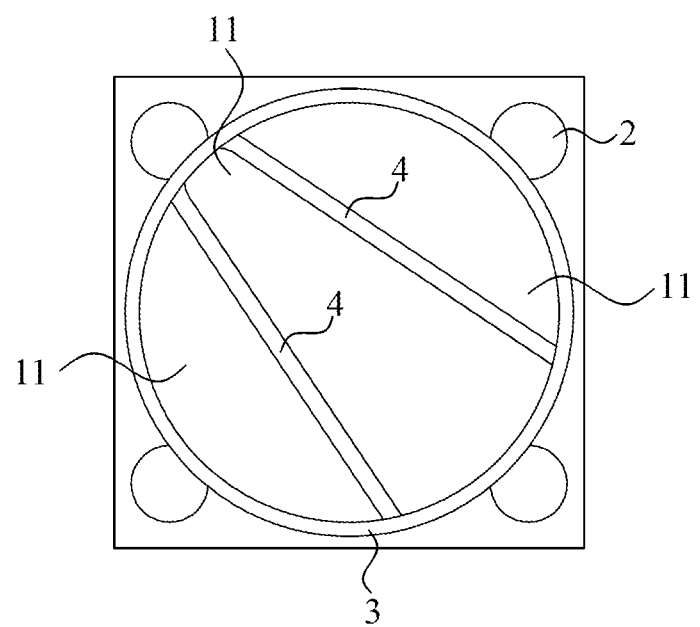
FIG. 5 is a schematic diagram of the structure in accordance with a second embodiment of the present invention with the fluorescent layer and the LED chip circuit being skipped.
Figure 6:
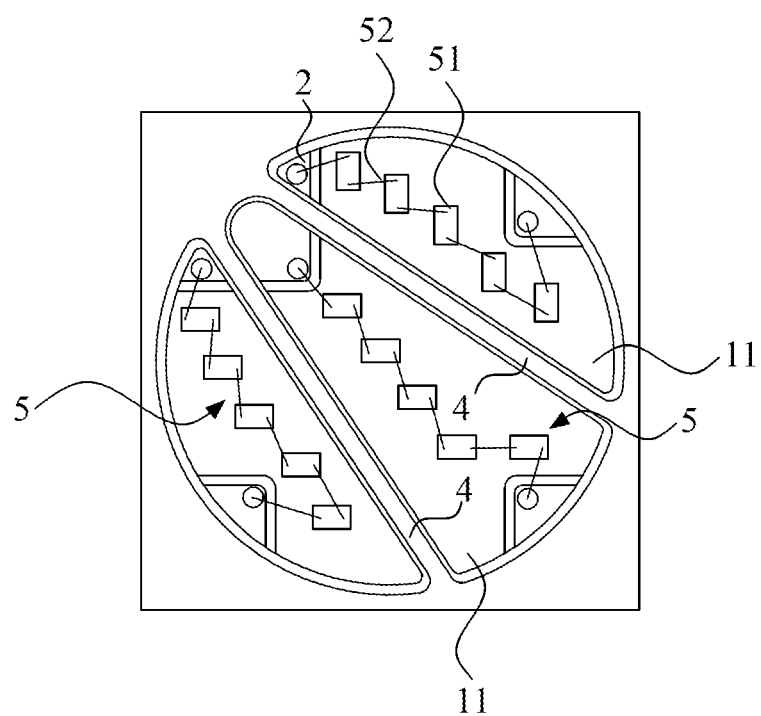
FIG. 6 is a schematic cross-sectional view of the second embodiment of the present invention.

Please refer to FIG. 5 and FIG. 6, in accordance with the second embodiment of the present invention, a number of the pad 2 is four, and the four pads are located at the four corners of the metal substrate. Among the four pads, two pads on the same side of the separated island are used as the multi-block negative electrodes, and the remaining two pads are used as the multi-block positive electrodes. The four pad design would be more applicable in actual practice.

In addition, the insulating resin dam 3 is provided with two white resin partitions 4 arranged inside. The white resin partitions 4 divide the metal substrate into three regions 11, and the three regions 11 are provided with different LED chip circuit. Thereby, three color temperatures may coexist in one EMC bracket structure.

In short, the present invention features a thermoelectric separation type bracket, with more than three pads arranged in the periphery of the metal substrate, at least one white resin partition arranged on the metal substrate and inside the cup-shaped insulating resin dam to have the metal substrate divided into multiple areas for locating different LED chip circuits. The circuits are connected through the pads served as multi-block negative electrode and positive electrode, so that color temperature can be set in each area independently without increasing the size of the overall product. In addition, the technology of multi-block color temperature control increases product diversity and application markets.

Although the present invention has been described in considerable detail with reference to certain preferred embodiments thereof, the disclosure is not for limiting the scope of the invention. Persons having ordinary skill in the art may make various modifications and changes without departing from the scope. Therefore, the scope of the appended claims should not be limited to the description of the preferred embodiments described above.

What is claimed is:

1. A multi-color temperature and multi-channel epoxy molding compound (EMC) bracket structure, comprising:
    a metal substrate;
    more than three pads, arranged on a periphery of the metal substrate, wherein the pads are used as multi-block electrodes of the metal substrate;
    a cup-shaped insulating resin dam, located on the metal substrate, wherein part of the pad is located inside the insulating resin dam, and another part of the pad is located outside the insulating resin dam;
    at least one white resin partition, arranged inside the insulating resin dam to divide the metal substrate into multiple areas;
    multiple LED chip circuits, wherein one LED chip circuit is arranged in each of the multiple areas and each of the multiple LED chip circuits comprises at least two LED chips wired in series, with the first one and the last one of the LED chips in the series each connected to a different one of the more than three pads;
    wherein each of the multiple LED chip circuits is associated with a different color temperature; and
    wherein spaces inside the cup-shaped insulating resin dam with respective to the LED chip circuits are encapsulated by fluorescent layers respectively, and the fluorescent layer is located on the LED chip.

2. The multi-color temperature and multi-channel EMC bracket structure according to claim 1, wherein a number of the pads is four, and the four pads are located at four corners of the metal substrate, and among the four pads, two pads on a side of a separated island are used as multi-block negative electrodes, and the remaining two pads are used as multi-block positive electrodes.

3. The multi-color temperature and multi-channel EMC bracket structure according to claim 1, wherein two white resin partitions are arranged inside the insulating resin dam, to divide the metal substrate into three areas for arranging different LED chip circuits.

* * * * *